(12) United States Patent
Papadantonakis et al.

(10) Patent No.: US 12,052,170 B2
(45) Date of Patent: **\*Jul. 30, 2024**

(54) CYCLIC REDUNDANCY CHECK (CRC) UPDATE MECHANISM

(71) Applicant: Intel Corporation, Santa Clara, CA (US)

(72) Inventors: Karl S. Papadantonakis, Agoura Hills, CA (US); Robert G. Southworth, Chatsworth, CA (US); Alain Gravel, Thousand Oaks, CA (US); Jonathan A. Dama, Encino, CA (US)

(73) Assignee: Intel Corporation, Santa Clara, CA (US)

( \* ) Notice: Subject to any disclaimer, the term of this patent is extended or adjusted under 35 U.S.C. 154(b) by 558 days.

This patent is subject to a terminal disclaimer.

(21) Appl. No.: 17/020,654

(22) Filed: Sep. 14, 2020

(65) Prior Publication Data

US 2020/0412649 A1 Dec. 31, 2020

Related U.S. Application Data

(63) Continuation of application No. 14/866,180, filed on Sep. 25, 2015, now Pat. No. 10,785,150.

(51) Int. Cl.
*H04L 45/74* (2022.01)
*H04L 69/22* (2022.01)

(52) U.S. Cl.
CPC .............. *H04L 45/74* (2013.01); *H04L 69/22* (2013.01)

(58) Field of Classification Search
None
See application file for complete search history.

(56) References Cited

U.S. PATENT DOCUMENTS

| 5,930,477 | A | | 7/1999 | Uchida | |
|---|---|---|---|---|---|
| 6,128,666 | A | \* | 10/2000 | Muller | H04L 69/22 709/215 |
| 6,625,764 | B1 | \* | 9/2003 | Dawson | H04L 69/22 714/703 |
| 7,093,109 | B1 | \* | 8/2006 | Davis | G06F 9/3802 712/228 |
| 7,243,289 | B1 | | 7/2007 | Madhusudhana et al. | |
| 8,578,240 | B1 | | 11/2013 | Pathakota et al. | |
| 8,918,706 | B1 | | 12/2014 | Lewis | |
| 9,860,168 | B1 | \* | 1/2018 | Seshadri | H04L 69/22 |
| 10,785,150 | B2 | | 9/2020 | Papadantonakis et al. | |
| 2001/0036196 | A1 | | 11/2001 | Blightman et al. | |
| 2003/0118053 | A1 | \* | 6/2003 | Edsall | H04L 67/1097 370/474 |

(Continued)

OTHER PUBLICATIONS

"U.S. Appl. No. 14/866,180, Advisory Action dated Jul. 9, 2018", 3 pgs.

(Continued)

*Primary Examiner* — Jeffrey M Rutkowski
*Assistant Examiner* — Mehedi S Aley
(74) *Attorney, Agent, or Firm* — Compass IP Law PC

(57) ABSTRACT

A cyclic redundancy code (CRC) update device includes an input coupled to obtain an old CRC that corresponds to an old header of a communication packet, a CRC storage device to store CRC coefficients, a CRC calculator coupled to receive a modified old header of the communication packet and calculate a new CRC on the modified old header, and a polynomial multiplier coupled to the CRC storage device to receive the new CRC, obtain a corresponding coefficient from the CRC storage device, and generate an update for the CRC of the frame.

21 Claims, 10 Drawing Sheets

(56) References Cited

U.S. PATENT DOCUMENTS

| | | | |
|---|---|---|---|
| 2004/0123221 A1* | 6/2004 | Huffman | H03M 13/093 714/776 |
| 2005/0192782 A1 | 9/2005 | Lee | |
| 2006/0248582 A1* | 11/2006 | Panjwani | H04L 47/10 726/13 |
| 2010/0135323 A1* | 6/2010 | Leong | H04L 69/04 370/474 |
| 2017/0093709 A1 | 3/2017 | Papadantonakis et al. | |

OTHER PUBLICATIONS

"U.S. Appl. No. 14/866,180, Amendment and Response filed Oct. 6, 2017 Non Final Office Action dated Jun. 5, 2017", 8 pgs.

"U.S. Appl. No. 14/866,180, Final Office Action dated Feb. 8, 2018", 22 pgs.

"U.S. Appl. No. 14/866,180, Final Office Action dated Oct. 7, 2019", 26 pgs.

"U.S. Appl. No. 14/866,180, Non Final Office Action dated Mar. 15, 2019", 26 pgs.

"U.S. Appl. No. 14/866,180, Non Final Office Action dated Jun. 5, 2017", 20 pgs.

"U.S. Appl. No. 14/866,180, Notice of Allowance dated May 19, 2020", 8 pgs.

"U.S. Appl. No. 14/866,180, Pre-Appeal Brief Request filed Feb. 6, 2020", 2 pgs.

"U.S. Appl. No. 14/866,180, Response filed Jun. 17, 2019 to Non-Final Office Action dated Mar. 15, 2019", 8 pgs.

"U.S. Appl. No. 14/866,180, Response to Final Office Action filed Jun. 8, 2018 to Final Office Action dated Feb. 8, 2018", 13 pgs.

\* cited by examiner

CYCLIC REDUNDANCY CHECK (CRC) UPDATE MECHANISM

This application is a continuation of U.S. patent application Ser. No. 14/866,180, filed Sep. 25, 2015, which is incorporated herein by reference in its entirety.

TECHNICAL FIELD

Embodiments described generally herein relate to processing of data packets sent or received through a network. Some embodiments relate updating a CRC of a data packet based on changes to a data packet.

BACKGROUND

Modern switching hardware supports packet rates exceeding 800 million packets per second, with multiple header updates per packet. Previous solutions re-compute the Ethernet cyclic redundancy check (CRC) after these header updates, rather than updating the CRC, due to complexities involved in updating the CRC at wide datapath endpoints where the data is serial. As a result, previous solutions cannot detect soft errors occurring in the datapath. The result is that soft errors occurring in the datapath are undetectable.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
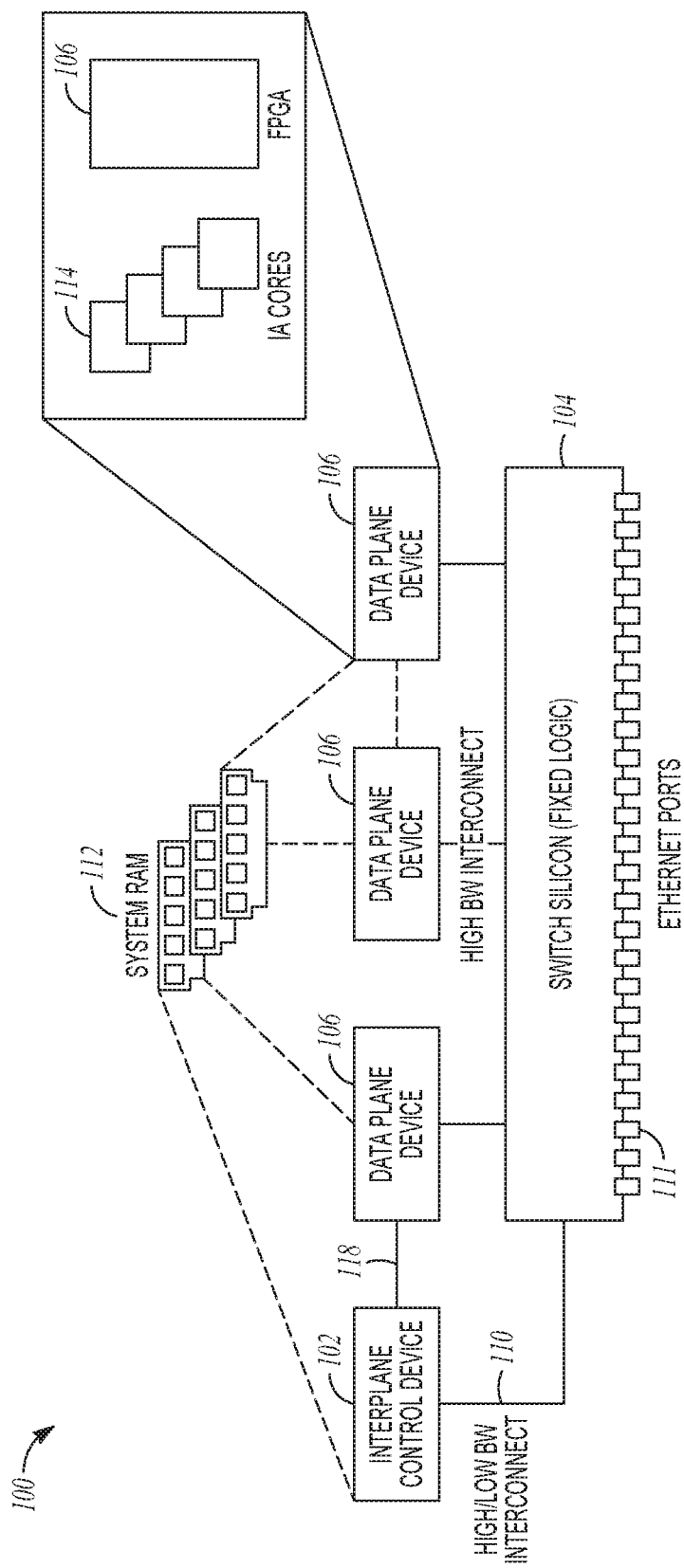
FIG. 1 is a block diagram illustrating components of a switching platform in which methods in accordance with some embodiments can be implemented.

In modern digital networks, data to be transmitted is often formatted into packets for transmission. A packet typically includes the data, or payload, to be transmitted, along with information necessary to route the packet from a source to a destination. Routing information may be placed in a packet header that includes, for example, a network address of the source device and a network address of the destination device, with a cyclic redundancy check (CRC) appended at the end of the message. Upon receipt of the packet, the destination device recomputes the CRC from the received bits in the header and the payload of the packet. The destination device compares the recomputed CRC and the transmitted CRC to determine whether an error has occurred during transmission.

Packets can take any number of routes between the source device and the destination device, and packets can also be re-routed through intermediate devices during transmission. Such re-routing may result in a change to a packet's header. Some available systems provide ways to recompute the packet CRC in order to reflect the changes in the header. This recomputing can be time consuming and computationally expensive. Additionally, an end receiver of packets may expect the CRC to detect soft errors within the datapath whereas the CRC will be unable to detect these soft errors. Accordingly, some CRCs are not currently protecting portions of the packet that CRCs were designed to protect.

Embodiments provide a CRC update mechanism that maintains a CRC through an entire datapath, and updates the CRC as portions of the data are modified in a wide datapath. The CRC of various embodiments can detect multiple soft errors arising in a packet payload at any point in the datapath, including during packet storage, field extraction, and recompaction. The CRC update mechanism in one embodiment is implemented in hardware and uses coefficient read-only memory (ROMs) (e.g., a CRC storage device or similar module), such as a count-indexed ROM, accessible by the CRC update mechanism to enable highly parallel ROM access and CRC update calculations. Latency is extremely low, and mostly hidden by (i.e., simultaneous with) the latency of packet header modification and compaction.

In various embodiments, the CRC update mechanism may be used in conjunction with error correction code (ECC) memory to enhance soft-error performance. Soft errors that are not detected by the ECC are extremely likely to be detected by the CRC. Various embodiments, rather than recomputing the entire CRC, do an update to the CRC by computing a change (i.e., "delta") and applying the delta at end of the frame.

An example switching platform is first described, followed by a description of modification of communication packet headers in a single cycle using multiple stages to place words of the headers in a correct lane. The CRC update mechanism is then described in the context of updating a packet CRC based on changes to the headers and avoiding recalculation of the CRC over the entire packet, which includes a payload. The update mechanism may perform the CRC update over a wide datapath in a single cycle, providing low latency.

Figure 2:
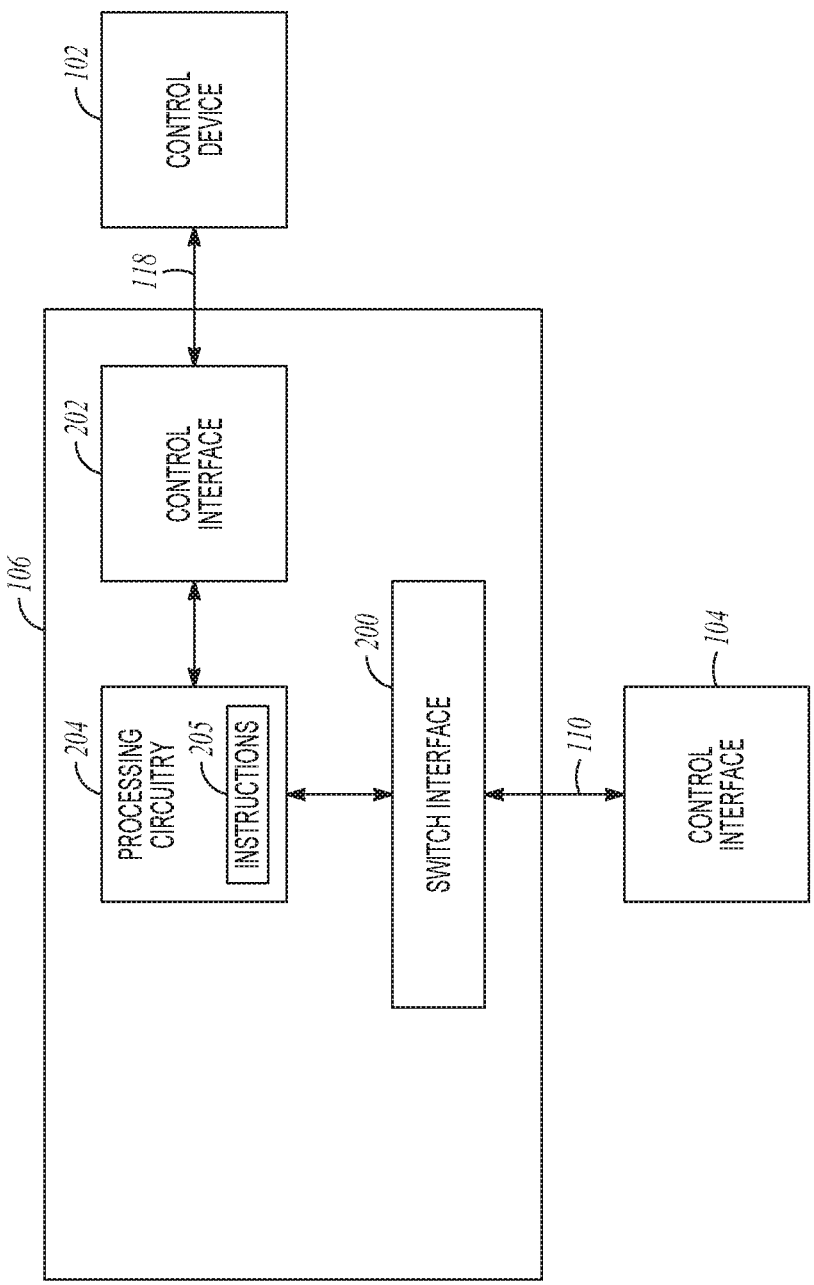
FIG. 2 is a block diagram of a control device in accordance with some embodiments.

FIGS. 1 and 2 provide a high level view of an example switching platform, followed by figures describing example embodiments of header compacting, figures describing example embodiments of updating a CRC, and a final figure illustrating hardware.

FIG. 1 is a block diagram illustrating components of a switching platform 100 in which methods in accordance with some embodiments can be implemented. A network operating system (in kernel or user space) runs on the switching platform 100 and, among other functionalities, manages a hardware switch 104, data plane devices 106, and associated accelerators programmed in the FPGA 108. The hardware switch 104 can include fixed-logic switch silicon (switch Si) circuitry or other hardware circuitry, and the hardware switch 104 can include a switch of the Intel® Ethernet Switch family, available from Intel Corporation of Santa Clara, CA Each of the data plane devices 106 are connected to the hardware switch 104 using very high-bandwidth, low-latency interconnects 110, which can support speeds of, for example, 10-100 Gigabit Ethernet (GbE) or higher. Additionally the data plane devices 106 are interconnected among each other to make a coherent fabric to access extended flow tables provided in random access memory (RAM) 112 of the switching platform 100, or to pass packets from one data plane device 106 to the next, among other uses.

The control device 102 initializes the hardware switch 104 and programs the switch ports of the hardware switch 104 facing the data plane devices 106, using flexible interfaces, to provide scalable flow processing that can be adapted for various usage models in addition to other data center usage models. The hardware switch 104 also receives packet streams and connects to other devices or systems using Ethernet ports 111. The control device 102 can execute (e.g., "run") on a specialized core in some embodiments. Alternatively, in other embodiments, the control device 102 (or processing circuitry of the control device 102) can be distributed among one or more Intel Architecture® (IA) cores 114, by way of nonlimiting example.

FIG. 2 illustrates a data plane device 106 in accordance with some embodiments. The data plane device 106 includes a switch interface 200 to communicate with one or more hardware switches such as for example the hardware switch 104 shown in FIG. 1. The data plane device 106 can act as a cyclic redundancy code (CRC) update device as described in more detail herein.

The data plane device 106 also includes a control interface 202 to communicate with one or more control devices 102 (FIG. 1).

The data plane device 106 includes processing circuitry 204 to perform functions such as packet header compaction and updating CRC of headers. It will be understood that any or all of the functions performed by processing circuitry 204 can be executed with hardware, software, firmware, or any combination thereof, on one or more processing cores, for example IA cores 114 or a core of the control device 102.

In embodiments, the processing circuitry 204 can determine destination lanes for multiple received headers that have been received at the switch interface 200 and permute words of the multiple received headers as described later herein with respect to FIGS. 3-6. The processing circuitry 204 can distribute the plurality of packet streams between the one or more hardware switches (e.g., the hardware switch 104 (FIG. 1) and software data plane components. Software data plane components can include elements for various functions, and software data plane components can execute on IA cores 114.

Figure 3:
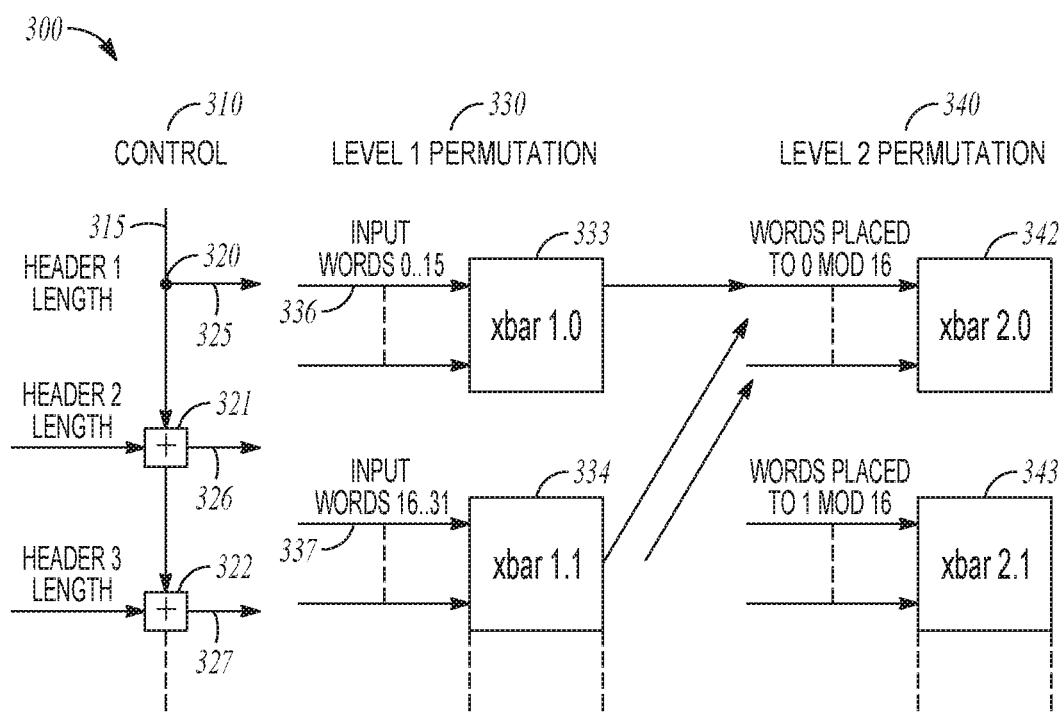
FIG. 3 is a block diagram of a compactor to transform headers in a switch according to an example embodiment.

FIG. 3 is a block diagram of a compactor 300 to transform packet headers received from another datapath (e.g., a routing table, or a tunnel-endpoint table by way of nonlimiting example). The compactor 300 will calculate the destination lanes of all the words received from the other datapath. The compactor 300 may be implemented in one or more of the elements of the switching platform 100 such as in data plane devices 106. Compactor 300 includes a control stage 310 coupled to receive multiple headers of a packet and having control logic to calculate a destination lane of each input word of the multiple headers by counting the number of previous words that are present.

The headers are received at 315. The length in words for each header is calculated via an adder as shown at 320, 321, and 322, and lanes for each header are output at lines 325, 326, 327, etc. In one embodiment, there are 16 adders and outputs corresponding to a 256 byte header, where each byte is a word comprising 8 bits. A running length calculation on header lengths is performed to determine the correct output lane or lanes for each header. For example, the first header calculation is trivial, because the first header is first. The first word of the first header becomes output word zero, followed by the rest of the words of the first header occupying word one, two, etc., up to the length of the header in words. The ultimate location of the second header depends on the size of the first header. If the first header had seven words, then the second header starts at word 7, and may also occupy words 8, 9, etc., up to the length in words of the second header. If the second header stops at word 9, by way of nonlimiting example, then the third header resumes at word 10.

The lanes for each header determined by the control stage 310 are then used to control a level 1 permutation 330 coupled to the control stage 310. Level 1 permutation 330 includes multiple crossbar switches indicated at 333, 334, etc. In one embodiment, 16 such crossbar switches are used in the level 1 permutation 330. Each crossbar switch receives 16 words, with the first crossbar switch 333 receiving input words 0-15 as indicated at 336, the second crossbar switch 334 receiving input words 16-31 as indicated at 337, etc. The level 1 permutation 330 places all the words into the correct lane MOD 16 words as directed by the control stage 310. If the individual headers are already compacted, the level 1 permutation 330 performs a simple rotation of 16 word chunks.

A level 2 permutation 340 consisting of multiple crossbar switches indicated at 342, 343, etc., is coupled to the level 1 permutation 330. The level 2 permutation 340 places all the words into the correct lane MOD 256 words. The representation of the levels or stages is compacted for ease of illustration, and thus not all individual elements and connections are visible, but would be apparent to one of skill in the art. In one embodiment, crossbar 342 handles words placed to 0 MOD 16, which includes words zero, 16, 32, 48, etc. Crossbar 343 handles words placed 1 MOD 16, which includes words one, 17, 33, 49, etc. The crossbars of the level 2 permutation 340 produce an interleaved output of the headers. If there are more than 256 words, then additional levels continue the pattern. The header is now fully compacted and correctly ordered for transfer from the switching platform 100.

Figure 4:
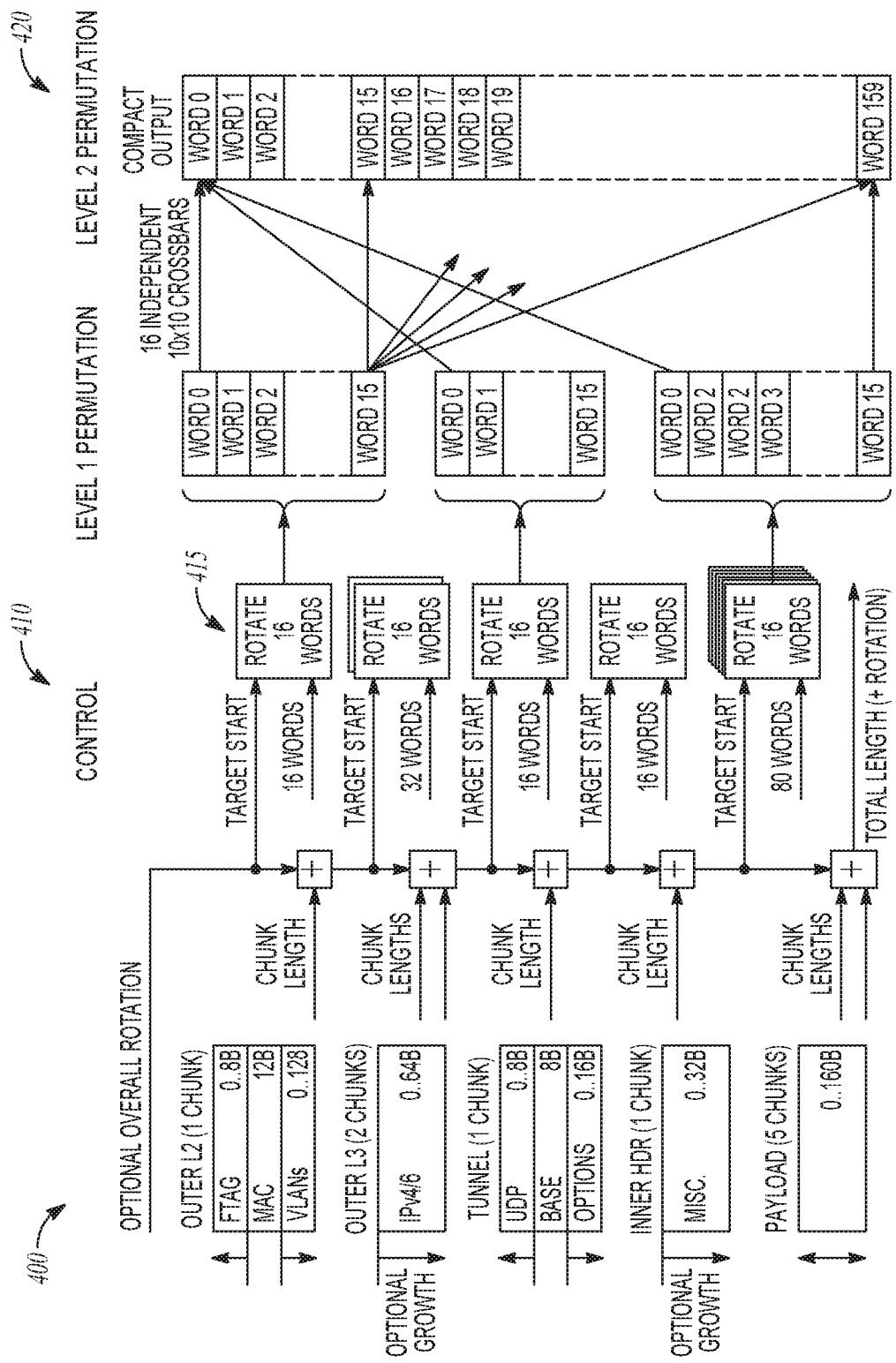
FIG. 4 is a block diagram of an alternative compactor to transform headers in a switch according to an example embodiment.

FIG. 4 is a block diagram of an alternative header transformation mechanism 400 that compacts up to 320 bytes (i.e. 160 words) in three stages of logic. A first stage of logic comprises control logic indicated at 410. Control logic 410 receives the packet headers and calculates a destination lane of each 16-bit input word by adding all previous header sizes to a constant offset of the word within the header. Chunk lengths are used to determine a target start for each header, where a chunk is a block of 16 input words that goes to the same level 1 permutation crossbar as described earlier herein. Thus, a calculation of the position of each word is avoided by feeding at most, one header into each level 1 permutation crossbar indicated at 415. The representation of the stages is compacted for ease of illustration, and thus not all individual elements and connections are visible, but would be apparent to one of skill in the art.

In some applications, an optional overall rotation to the compacted result may be performed by adding the desired overall rotation into the control logic as noted in FIG. 4.

Level 1 permutation at 415 places all words into the correct lane MOD 16 words. In this example embodiment, the individual headers are already internally compacted when received by mechanism 400, so this is a simple rotation within 16-word chunks, which results in savings on the amount of control utilized to transform the headers. Each header is 1-2 chunks and the payload is 5 chunks. This rotation is conflict-free because each chunk of header is at most 16 words. Therefore, the destination lanes of these 16 words do not have any conflicts MOD 16. This property holds even if the headers had not initially been compacted. Given any set of 16 words to be compacted in one of the level 1 permutation crossbars, the resulting positions are a consecutive run of no more than 16 words, and therefore each of these words is destined to a different level 2 permutation crossbar. A similar property holds at each later stage or level.

The level 2 permutation at 420 places all words into the correct output lane. The placement is achieved via 16 independent 10×10-word crossbars in one embodiment. The control logic for the level 2 permutation at 420 can be computed as a 160-bit destination-mask per chunk. The mask is set to 1s over the range (start . . . start+length−1) that was calculated for that chunk in the control logic 410. For lowest latency, this mask generation occurs in parallel with the level 1 permutation.

The crossbar function in the level 2 permutation 420 takes each output word from the word having the same position MOD 16, and its corresponding destination mask bit set. This amounts to a 10-input mux per output, with one-hot control per mux.

Figure 5:
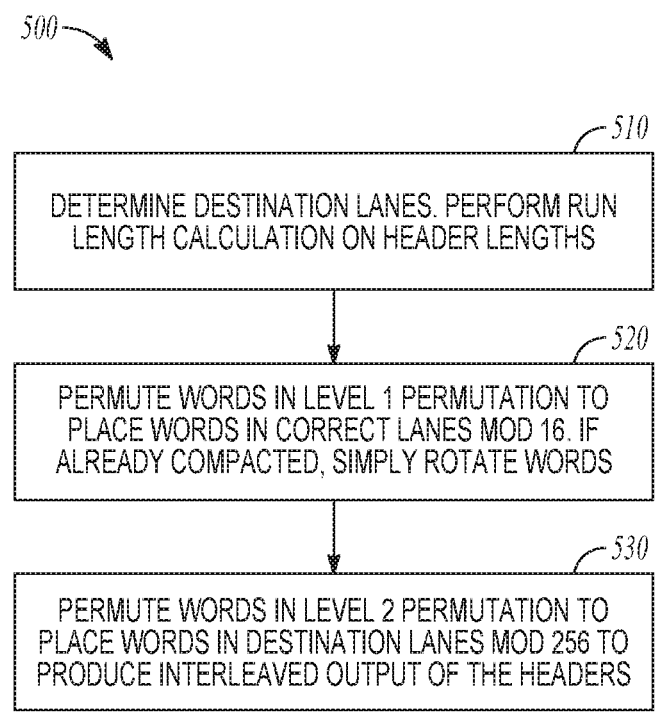
FIG. 5 is a flowchart illustrating a method of transforming multiple headers of a communication packet according to an example embodiment.

FIG. 5 is a flowchart illustrating operation of the stages or levels of compactor 300 to perform a method 500 of processing communication packets. In one embodiment, the method includes determining at 510, destination lanes for multiple received headers of a communication packet to provide determined destination lanes. A running length calculation on header lengths is performed to determine the correct output lane or lanes for each header. For example, the first header at is trivial, because it is first. The first word of the first header becomes output word zero, followed by the rest of the words of the first header occupying word one, two, etc., up to the length of the header in words. For the second header, its ultimate location depends on the size of the first header. If the first header had seven words, then the second header starts at word 7, and may also occupy words 8, 9, etc., up to the length in words of the second header. If it stops at word 9, the third header resumes at word 10.

At 520, words of the headers are permuted in a level 1 permutation to place words into a correct lane according to the determined destination lanes. In one embodiment, the compactor receives multiple headers for a packet comprising 256 words. The level 1 permutation may use crossbar switches to place all the words into the correct lane MOD 16 words as directed by the control stage. Note that 16 is the square root of 256. If the individual headers are already compacted, the level 1 permutation performs a simple rotation of 16 word chunks.

At 530, words received from the level 1 permutation are permuted in a level 2 permutation to place each word into a correct destination lane according to the determined destination lane. Multiple crossbar switches may be used in the level 2 permutation to place all the words into the correct lane MOD 256 words. In one embodiment, a first crossbar switch handles words placed to 0 MOD 16, which includes words zero, 16, 32, 48, etc. A next crossbar switch handles words placed 1 MOD 16, which includes words one, 17, 33, 49, etc. The crossbars of the level 2 permutation produce an interleaved output of the headers. If there are more than 256 words, then additional levels continue the pattern. The header is now fully compacted and correctly ordered for transfer from the switching platform.

Figure 6:
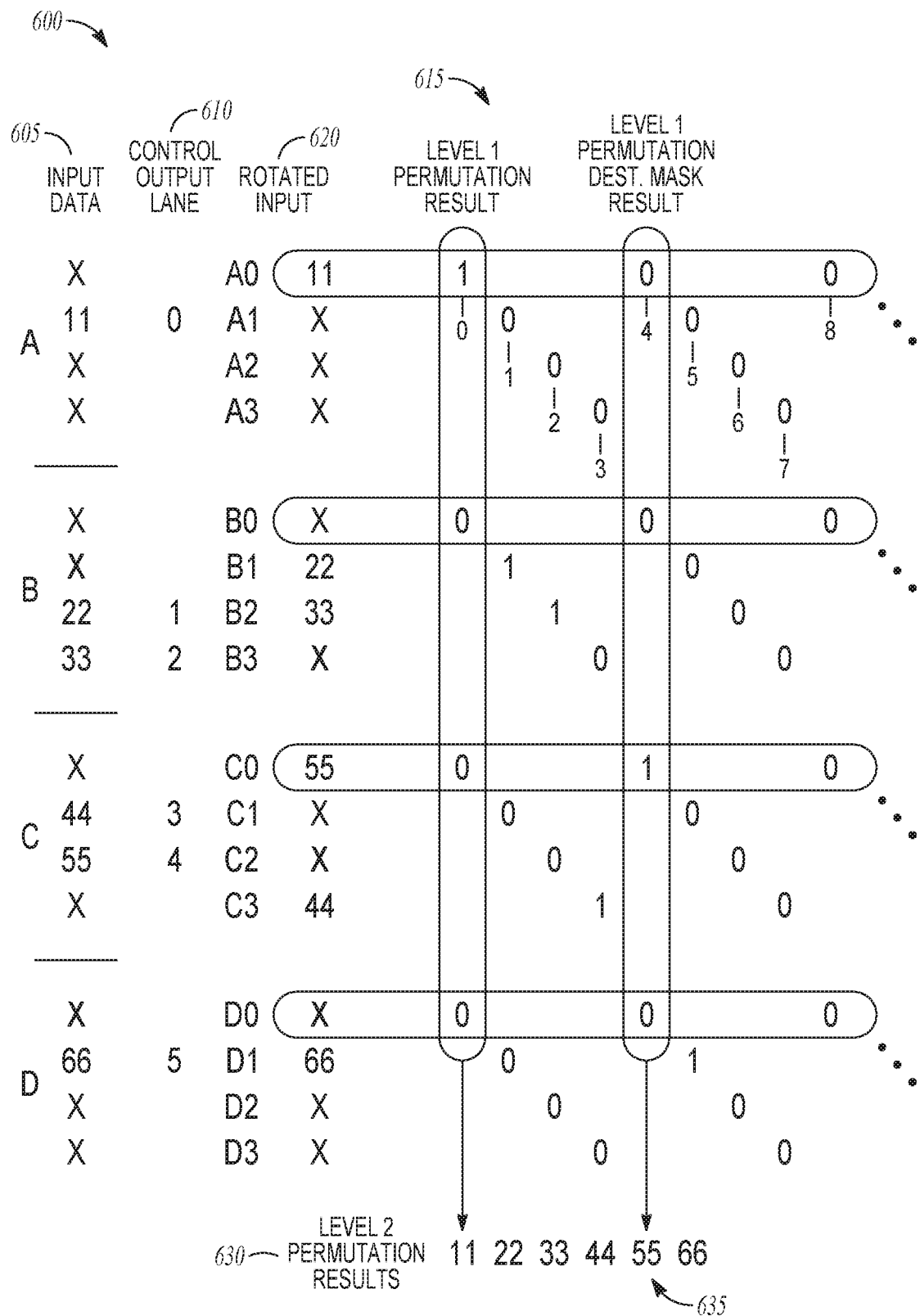
FIG. 6 is an illustration of example words of multiple headers being transformed via a multiple stage compactor according to an example embodiment.

FIG. 6 is a data flow representation of a 16-word compactor indicated generally at 600. FIG. 6 can be compared and contrasted with FIG. 4 in that FIG. 4 illustrates a similar 256-word compactor. 16 words was chosen to allow ease of representation in a single sheet of drawing. Input data 605 includes 16 input words. Invalid words are represented with an "X". The input words are organized into 4 blocks of 4 words each. The blocks are labeled: A, B, C, and D, and individual words are labeled A0, A1, A2, A3; B0, B1, B2, B3; C0, C1, C2, C3; and D0, D1, D2 and D3.

A control stage is indicated at 610 and includes logic to calculate output lanes of all words. In addition to other operations, the control stage 610 can remove invalid words. In the example of FIG. 6, the input blocks are already compacted so a "rotation amount" per A, B, C, and D may be used.

The level 1 permutation at 615 receives the rotated input at 620 and places all words into correct position MOD 4. Since the input blocks are already compacted, this is just a rotation. Level 1 permutation also calculates a 16-bit destination mask for each rotated block as shown at 625. In the level 1 permutation at 615. A, B. C and D are processed independently and accordingly space can be saved in various embodiments at least because only 4×4 crossbars are needed in the level 1 permutation 615.

Level 2 permutation is indicated at 630 and may be an array of 4-input muxes, each controlled by 1-of-4 one-hot. The level 2 permutation result is indicated at 635 and shows each word in a correct lane, resulting in a compacted contiguous header block as an output for the packet.

In the level 2 permutation indicated at 630, each output (e.g., output 0, 1, 2, 3, 4, 5, 6, 7 and 8 shown in FIG. 6) can only come from a set of specific locations. For example, output 0 can only come from A0, B0, C0 or D0; output 1 can only come from A1, B1, C1 or D1; output 2 can only come from A2, B2, C2 or D2; and output 3 can only come from A3, B3, C3 or D3. Accordingly, 4×4 crossbars may be used to implement the level 2 permutation, resulting in further space savings in various embodiments.

Figure 7:
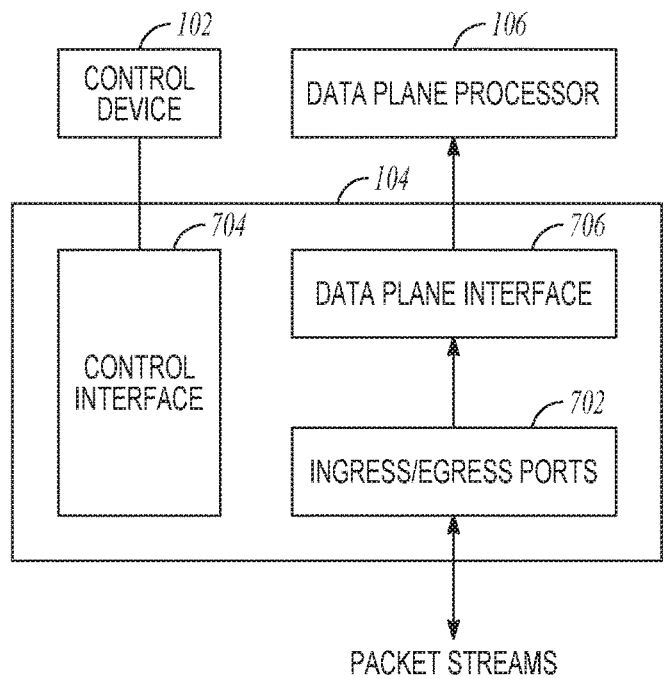
FIG. 7 is a block diagram of a hardware switch in accordance with some embodiments.

FIG. 7 is a block diagram of hardware switch 104 in accordance with some embodiments. The hardware switch 104 includes ingress ports (for example ingress/egress ports 702) for receiving a data packet having multiple headers and an old cyclic redundancy code (CRC) that corresponds to an old portion (e.g., an old header header) of a frame. The ingress/egress ports 702 can also be referred to as Ethernet ports, communication ports, etc. and the ingress/egress ports 702 can include processing circuitry (not shown in FIG. 7) for parsing, routing, packet modification, etc.

The hardware switch 104 includes a control interface 704 to communicate with a control device 102 and a switch data plane interface 706 to communicate with one or more data plane processors 106. Accordingly, a basic switch 104 pipeline can include receiving data at ingress/egress ports 702, performing processing at ingress/egress ports 702 (such as parsing, routing modification of packets, etc.), and providing packets to the data plane interface 706 or other circuitry. The switch 104 pipeline can include further combinations of the above, for example, after modification of packets is complete, parsing may be performed again. Packet processing and modification can also be implemented in the one or more data plane devices 106.

As described later herein, the hardware switch 104 generates an updated CRC according to algorithms described later herein. The hardware switch 104 can include memory 708 or can access other memory to retrieve CRC coefficients as described later herein.

In one embodiment, a CRC is updated based on the changed headers to obtain a valid CRC for the corresponding communication packet without recomputing the CRC for the entire packet. The headers may be changed using the compactors described above, or via any other mechanism that changes only a portion of the packet, such as one or more headers of a packet. The packet may also be referred to as a frame, but a frame is not limited to being packet for purposes of updating a CRC. A frame may be any chunk of data on which it is desired to have a CRC to correct an error in the data. A delta based on the changed data may be calculated and used to modify the CRC for the packet that existed prior to the modification of the header. In one embodiment, the CRC comprises an Ethernet CRC capable of correcting a bit error and updating the CRC is a low latency computation. In one embodiment, the CRC may be updated in a parallel datapath that modifies a portion of the data (e.g. a header or a portion of a header, or one header of a plurality of headers) in a frame.

Figure 8:
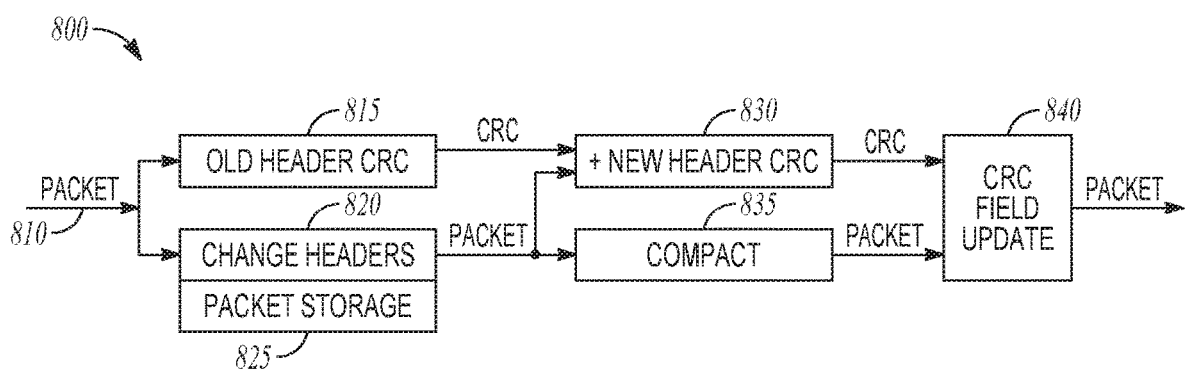
FIG. 8 is a block flow diagram illustrating a CRC update mechanism that updates a packet's CRC in accordance with some embodiments.

FIG. 8 is a block flow diagram illustrating a CRC update mechanism 800 that updates a packet's CRC. The CRC update mechanism 800 can be incorporated in processing circuitry 204 (FIG. 2) or in any component of the system 100 (FIG. 1) as one or more software modules, firmware modules, circuitry, etc.

A packet is received by mechanism 800 at 810 wherein an input is coupled to obtain an old CRC that corresponds to an old portion (e.g., an old header) of a packet. As mentioned above, the packet may also be referred to as a frame of data, or a block of data that already has a CRC calculated over it. In the context of a packet, the packet may be processed in a wide datapath. This means that the packet is broken into two or more pieces that may be processed in parallel. As indicated in the header compaction mechanism examples described above, the packet headers are split into words, such as 256 words that may be processed in a wide datapath consisting of 16 crossbars per stage as described earlier herein with respect to FIGS. 3-6.

In mechanism 800, logic (e.g., a CRC calculator module) calculates an old header CRC 815 over the header, and splits the old header CRC 815 off from the packet. The headers of the packet may proceed to a change header path 820 where the headers are changed, transformed or otherwise modified. The payload of the packet may be stored at 825. Logic (e.g., the CRC calculator) can calculate a new header CRC 830 over the changed header. Circuitry or logic can compact and combine the changed headers with the stored packet payload at 835. Packet header modifications can insert or delete bytes, so that the header length (and therefore the whole packet length) can change. The recombined packet and the new header CRC are then provided to a CRC field update logic module 840.

In one embodiment, the old header packet 815 is used to negate the contribution of the old header values to the CRC over the packet. To make this value mathematically compatible with the CRC field, the CRC is advanced by the number of bytes occurring after all headers in the received packet. In latency-sensitive applications, this is achieved via a coefficient ROM per header and by the use of polynomial multiplication using logic (e.g., a polynomial multiplier module).

"+new header CRC" at 830 takes into account the contribution of the new header values. To make the new header CRC 830 value mathematically compatible with the CRC field, the CRC is advanced by the number of bytes occurring after all headers, similarly as that described earlier.

When the CRC field is received, both updates are added to it at 840, and the value is added into the CRC field. For a large packet, this may occur several cycles after the packet headers are modified.

All of the CRC calculation latency may be hidden by header changes and compaction, because the CRC updates performed at 830 in various embodiments are performed in parallel to compaction at 835. The effective latency is therefore only the single-cycle latency of combining the three final components and inserting them into the CRC field. While example embodiments below are described with reference to one set of inputs, and modules (e.g., polynomial multiples, CRC calculators, etc.), it will be appreciated that the mechanism 800 can comprise multiple sets of inputs, CRC calculators and polynomial multipliers. These multiple components, inputs, modules, etc., can be disposed in a parallel datapath to generate multiple updates for the CRC of the frame corresponding to multiple headers of the frame.

Known solutions lead to holes in CRC protection, or serial, highly-replicated CRC blocks that add more area and power. Additionally, use of serial blocks in a large system can require repeatedly converting back and forth between serial and parallel implementations, which adds latency and complexity. In previous solutions, the ingress and egress CRC must both be calculated. To cover soft error gaps, these solutions would have to calculate old and new CRC in the same place, requiring all ingress headers to be copied, costing substantial area and power. Previous solutions also require shifting the final CRC by an arbitrary variable amount, which increases cost on a wide datapath.

Previous software solutions overcome the variable shifting problem by using a data-byte-indexed ROM (e.g., CRC_TABLE stored in ROM in pseudocode examples later herein) to calculate the CRC (crc in pseudocode examples below). Such solutions are completely impractical for hardware because this ROM is consulted sequentially for every byte in the packet. In contrast, present embodiments may use a count-indexed ROM, which is accessed only once per packet header. Furthermore, all accesses to this ROM can occur simultaneously. For example, considering the example of advancing a CRC by N=100 bytes. In a standard data-byte-indexed ROM, a system would have to do 100 lookups in sequence, causing the latency to be 100 times the table-lookup time, according to the pseudocode below:

TABLE 1 pseudocode for data-byte-indexed ROM.

for (i=0; i<N; i++)
crc=CRC_TABLE[crc^data]^(crc>>8);

In practice, some operators may generate CRC of specific sizes, resulting in the need for multiple circuits, and ever-increasing numbers of gates, to deal with the various possible packet sizes that can be needed in modern networking systems. In contrast, various embodiments use a count-indexed ROM, as below:

TABLE 2 pseudocode for count-indexed ROM crc=(CRC_TABLE[N] * crc) MOD P

Wherein the * operator and the MOD operator occur in GF2[x].

Figure 9:
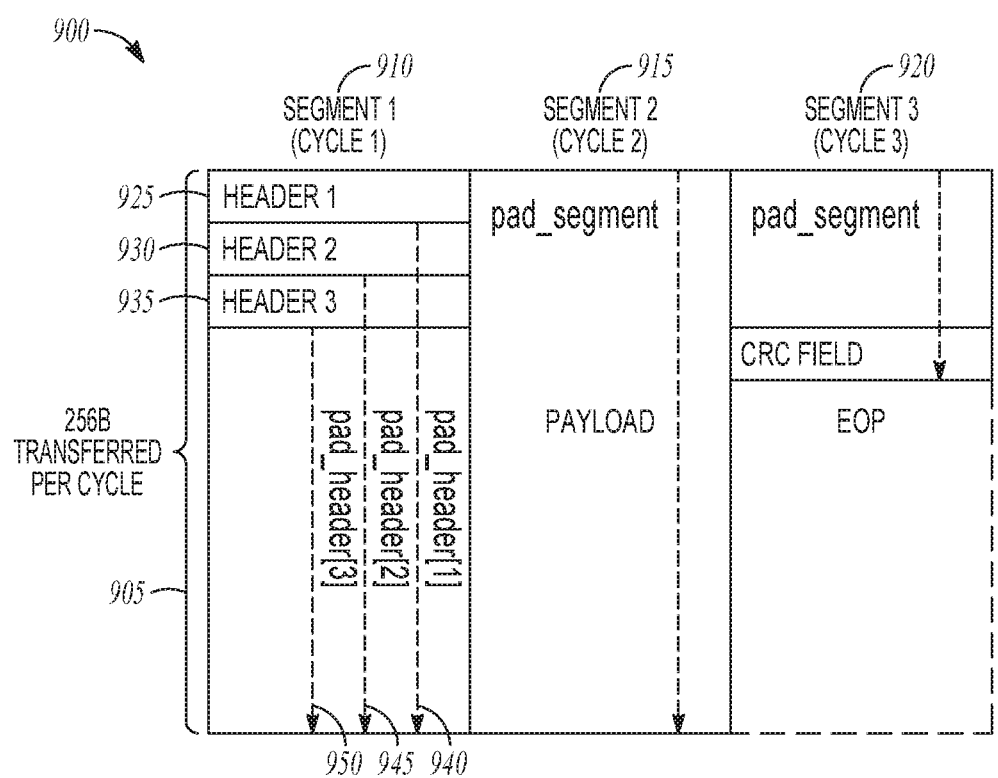
FIG. 9 is a block diagram illustrating CRC calculation for individual headers in accordance with some embodiments.

In one embodiment, a CRC is calculated for individual headers as illustrated in block diagram form in FIG. 9 generally at 900. The CRCs are advanced by a variable number of following bytes in a single operation. Previous solutions would require iteration in proportion to the number of bytes.

For example, an Ethernet packet is carried through a 256-byte (128-word) datapath 905 in one or more cycles 910, 915, and 920. In each cycle, one 256-byte segment is processed. The first segment contains 3 headers 925, 930, 935. For each header, a packet parser has provided the number of bytes that follow that header in the segment as indicated at 940, 945, and 950. For example, there are pad_header[1] bytes as indicated at 940 from the end of header 1 to the end of the segment 1. There are pad_header [2] bytes as indicated at 945 from the end of header 2 to the end of segment 1. There are pad_header[3] bytes as indicated at 950 from the end of header 3 to the end of segment 1. Segment 2 includes a payload, and segment 3 includes a pad segment and the CRC field, which signifies the end of the packet.

The CRC may be calculated according to a standard of the Institute of Electrical and Electronics Engineers (IEEE) family of standards. In some embodiments, the CRC is calculated in accordance with IEEE 802.3 or versions thereof. A packet in one embodiment may be represented as a polynomial. The terms of the polynomial are powers of the symbol x, and the coefficients are bits MOD 2. The constant $x^0$ term is the last bit transmitted; the $x^1$ term is the second-last transmitted, etc. Embodiments can be used to calculate any checksum that is "packet MOD P" where the arithmetic is in GF2[x] MOD P (x) (where GF2 refers to the Galois field as understood by those of ordinary skill in the art) for some reducing polynomial P. Some example reducing polynomials can include CRC-32, CRC-32K (Koopman), CRC-32C (iSCSI), CRC-32Q (AIXM), etc., although embodiments are not limited to just these reducing polynomials.

IEEE 802.3 specifies an Ethernet CRC Polynomial, which is notated as P. A packet's CRC is calculated by taking the packet polynomial modulo P.

In one embodiment, the CRC of a packet consisting of header H and payload Y is calculated. Such a packet has a form shown by (1):

$$packet = x^{8n}H + Y \quad (1)$$

where "n" is the number of bytes after the header. The CRC of the packet is calculated by feeding n into a ROM implementing $x^{8n}$ mod P.

The formula used for the calculation may be derived according to the derivation (2) as follows:

$$CRC(\text{packet}) = (\text{packet}) \bmod P \text{ // definition of CRC} \quad (2)$$

$$= (x^{8n}H + Y) \bmod P \text{ // packet structure with 1 header}$$

$$= [(x^{8n} \bmod P) \times (H \bmod P)] \bmod P +$$

$$(Y \bmod P) \text{ // MOD distributes over + and } \times$$

$$= CRC[ROM(n) \times CRC(H)] + CRC(Y) \text{ //}$$

definitions of CRC and ROM, where ROM(n) is count-indexed ROM

Note that "×" is polynomial multiplication, which has lower hardware complexity than integer multiplication.

The algorithm in (2) also generalizes to multiple headers as shown in (3):

$$CRC(\text{packet}) = CRC[ROM(n1) \times CRC(H1) + \quad (3)$$
$$ROM(n2) \times CRC(H2) + ROM(n3) \times CRC(H3)] + CRC(Y)$$

where CRC(packet) is the overall CRC of the entire packet, CRC(Y) is the CRC of the payload. ROM(n1), ROM(n2), ROM(n3), etc. are $x^{8n}$ mod P, where n is the number of bytes after each of the respective headers H1, H2 and H3. Assuming that modifications to the packet do not affect the payload Y, CRC(Y) is not changed by packet modification. Therefore, the difference between old and new packet CRC does not depend on Y. In more detail, ROMs are constructed when a designer first calculates the range of possible values for n. For example, if the minimum possible header size is 14 bytes, and the maximum packet size is 256 bytes, then the range of n is 0 to 42. Next, the constant values x^(8*0) . . . x^(242*0) are fed to a standard ROM generator.

To update a packet's CRC, the following algorithm may be applied to both the old and new packet headers. The payload is not involved in the calculation.

In the following annotated pseudo-code, "CRC" is a standard fixed-function Ethernet CRC implemented as an exclusive OR (XOR) tree; it performs a full modulo reduction of any input polynomial (of known maximum size) and produces a 32-bit result.

TABLE 3

Pseudo-code of algorithm for updating a packet's CRC.

```
crc32 = 0; //this is a 32-bit accumulator.
crc64; //this is a temporary, 64-bit accumulator.
for each segment (header[ ], pad_header[ ], pad_segment)
    {
        // pad previous segment crc32 to current end-of-segment
        rom_entry = CRC(1 <<8*pad_segment);
        crc64 = crc32 * rom_entry; // polynomial multiplication
        // pad each header to end-of-segment
        if (first segment)
            for each header[i]
            {
                rom_entry = CRC(1 <<8*pad_header[i]); // ROM
                    lookup; i =0. .255
                header_crc = CRC(header[i]);
                crc64 += rom_entry * header_crc; // polynomial
                    multiplication and XOR
            }
        //final modulo reduction
        crc32 = CRC(crc64)
    }
```

It will be appreciated that some of the above-described embodiments may be used for cases in which an entire packet is processed as a unit. However, in cases where this is not practical, because of large packet sizes, a more general algorithm can be performed by taking a larger packet in segments consisting of a known or limited number of bytes per segment.

Figure 10:
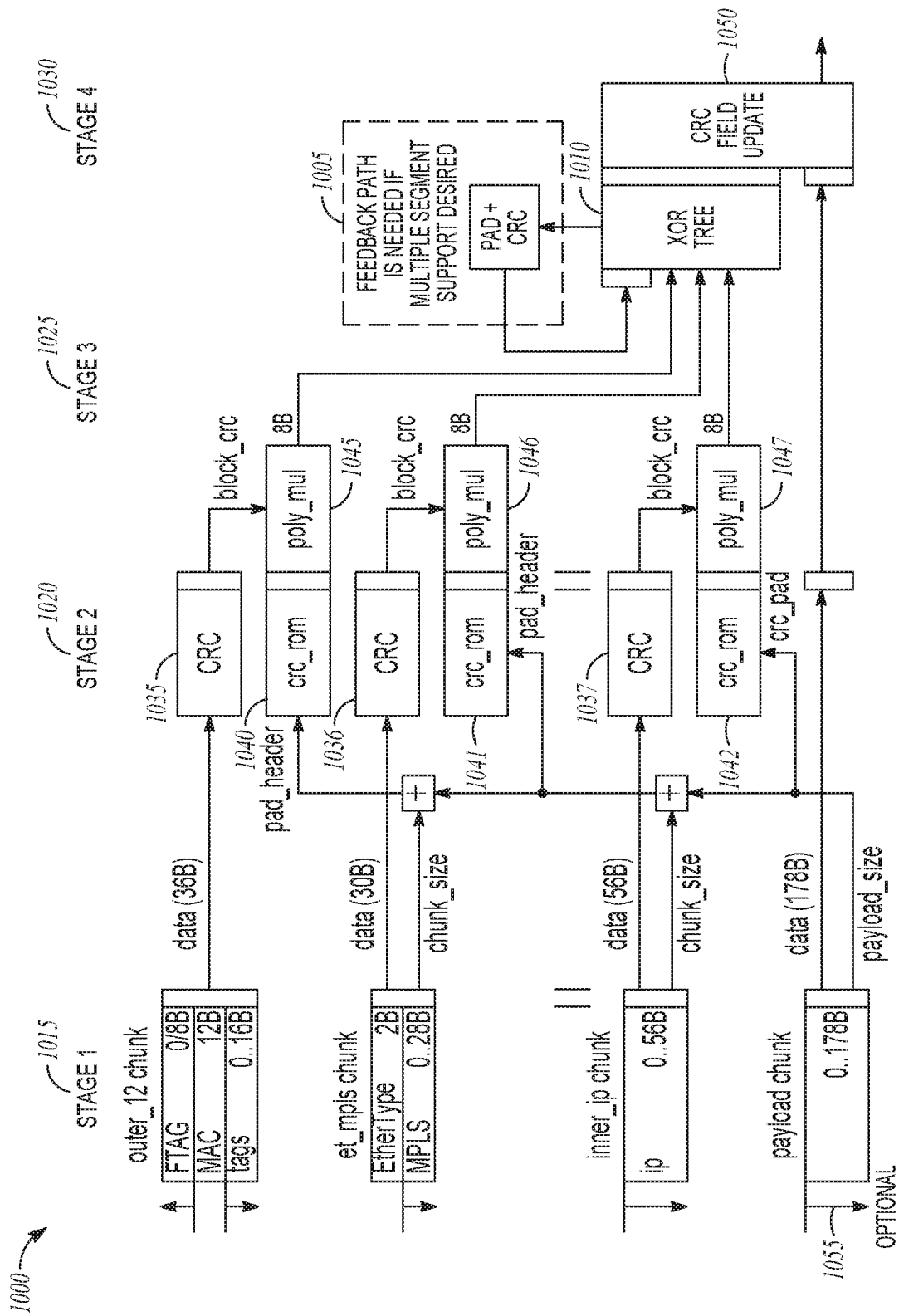
FIG. 10 is a block diagram illustrating a pipelined datapath generally at 1000 to handle one 256-byte packet per cycle in accordance with some embodiments.

FIG. 10 is a block diagram illustrating a pipelined datapath generally at 1000 to handle one 256-byte packet per cycle. It will be appreciated that the datapath at 1000 corresponds to the new header CRC 830 (FIG. 8). Calculation of an old header CRC 815 (FIG. 8) is relatively less complex because an ingress packet is already compact, so all the headers can be processed as one big header.

To handle packets larger than 256 bytes, a feedback path 1005 may be used. Pseudocode shown in Table 3, supra, can be used in the feedback path 1005.

For segments that are not the last segment, this path 1000 easily fits in 1 cycle because it is a fixed XOR-tree operation as indicated at 1010, to CRC a 64-bit input followed by 256 bytes of 0. This assumes that only the last segment can be less than 256 bytes as represented in segment 3 in FIG. 9. Additionally, CRCs in accordance with various embodiments can reasonable handle non-last segments being any length between 0 and 256 bytes, i.e., non-last segments do not have to be fixed at a constant size.

For the last segment, there may be additional latency for ROM lookup of CRC (1<<8*pad_segment) and polynomial multiplication requiring additional stages. However, a throughput of one segment per cycle is still possible because the last-segment latency can be pipelined. Furthermore, some embodiments may not experience significant ROM lookup latency because, after the first segment, only the polynomial multiplication contributes latency. The ROM lookup can be done earlier in the pipeline in various embodiments because the segment length is known earlier and the ROM only needs the segment length, based on a reasonable assumption that modifications only occur in the first segment, the lengths of the later segments do not change and hence are known earlier in the pipeline.

Datapath 1000 is shown divided into four stages generally illustrated at 1015, 1020, 1025, and 1030. Stage 1015 receives packet data in a wide path and provides the changed headers to CRC blocks indicated at 1035, 1036, 1037, etc. Note that not all bocks are illustrated for convenience of illustration. Each CRC block has access to a CRC ROM as indicated at 1040, 1041, and 1042, and uses the CRC ROM for each header to look up a value to multiply the old CRC by to calculate a new CRC, which is provided via a polynomial multipliers 1045, 1046, 1047 to the XOR tree 1010, which provides a CRC field update at 1050. Note that while the wide path is 256 B in this example, optional growth in the size is indicated by arrows such as arrow 1055. Note also that the size of the ROM may be much less than the size of the packet. The size of the ROM is related to the size of the headers in the packet, and is likely much smaller than the overall size of the packet, which may be quite large. In one embodiment, the size of the ROM is equal to the number of bytes in the segment.

Figure 11:
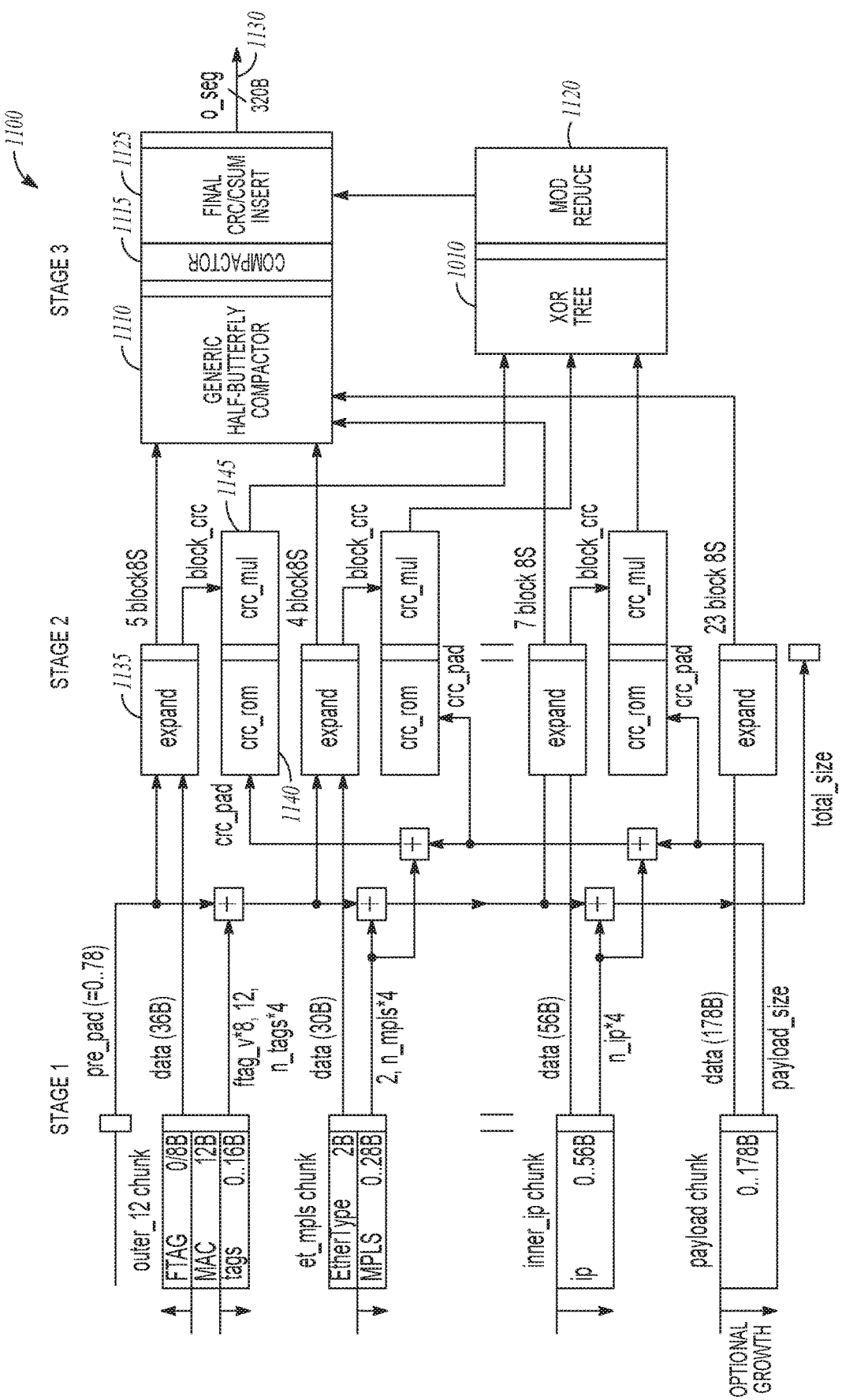
FIG. 11 is a block diagram illustrating a compactor and CRC update combined into a single datapath in accordance with some embodiments.

In a further embodiment illustrated in block diagram form in FIG. 11, both a compactor and CRC update are combined into a single datapath at 1100. The compactor is indicated as a generic half-butterfly compactor at 1110 and a compactor at 1115. The CRCs from the headers are again provided to the XOR tree 1010. MOD reduced at 1120, and provided to a final CRC/checksum insert 1125 along with the compacted headers to provide the headers with new CRC at an output 1130.

Data is received at expand blocks 1135 and provided to a CRC multiplier 1145 which uses the CRC ROM 1140 to provide the new CRC for each header to the XOR tree 1010. The expand blocks 1135 may also provide data for the headers to the half-butterfly compactor 1110 for compaction and placement into output lanes as described earlier herein.

The term "module" is understood to encompass a tangible entity, be that an entity that is physically constructed, specifically configured (e.g., hardwired), or temporarily (e.g., transitorily) configured (e.g., programmed) to operate in a specified manner or to perform at least part of any operation described herein. Considering examples in which modules are temporarily configured, a module need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. The term "application," or variants thereof, is used expansively herein to include routines, program modules, programs, components, and the like, and may be implemented on various system configurations, including single-processor or multiprocessor systems, microprocessor-based electronics, single-core or multi-core systems, combinations thereof, and the like. Thus, the term application may be used to refer to an embodiment of software or to hardware arranged to perform at least part of any operation described herein.

While a machine-readable medium may include a single medium, the term "machine-readable medium" may include a single medium or multiple media (e.g., a centralized or distributed database, and/or associated caches and servers).

The term "machine-readable medium" may include any medium that is capable of storing, encoding, or carrying instructions 205 for execution by a machine (e.g., the control device 102 or any other module) and that cause the machine to perform any one or more of the techniques of the present disclosure, or that is capable of storing, encoding or carrying data structures used by or associated with such instructions. In other words, the processing circuitry 204 (FIG. 2) can include instructions and can therefore be termed a machine-readable medium in the context of various embodiments. Other non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 205 may further be transmitted or received over a communications network using a transmission medium utilizing any one of a number of transfer protocols (e.g., frame relay, internet protocol (IP), TCP, user datagram protocol (UDP), hypertext transfer protocol (HTTP), etc.). Example communication networks may include a local area network (LAN), a wide area network (WAN), a packet data network (e.g., the Internet), mobile telephone networks ((e.g., channel access methods including Code Division Multiple Access (CDMA). Time-division multiple access (TDMA), Frequency-division multiple access (FDMA), and Orthogonal Frequency Division Multiple Access (OFDMA) and cellular networks such as Global System for Mobile Communications (GSM), Universal Mobile Telecommunications System (UMTS), CDMA 2000 1×* standards and Long Term Evolution (LTE)), Plain Old Telephone (POTS) networks, and wireless data networks (e.g., Institute of Electrical and Electronics Engineers (IEEE) 802 family of standards including IEEE 802.11 standards (WiFi). IEEE 802.16 standards (WiMax®) and others), peer-to-peer (P2P) networks, or other protocols now known or later developed.

The term "transmission medium" shall be taken to include any intangible medium that is capable of storing, encoding or carrying instructions for execution by hardware processing circuitry, and includes digital or analog communications signals or other intangible medium to facilitate communication of such software.

ADDITIONAL NOTES & EXAMPLES

Example 1 includes subject matter (such as a control device, interplane control device, control plane processor, CRC update device, computer device and or any other electrical apparatus, device or processor) including an input coupled to obtain an old CRC that corresponds to an old header of a communications packet; a CRC storage device to store CRC coefficients; a CRC calculator coupled to receive a modified old header and calculate a new CRC on the modified old header; and a polynomial multiplier coupled to the CRC storage device to obtain a coefficient from the CRC storage device, the polynomial multiplier further coupled to the CRC calculator to receive the new CRC, wherein the polynomial multiplier is configured to generate an updated CRC.

In Example 2, the subject matter of Example 1 can optionally include multiple sets of inputs, multiple CRC calculators and multiple polynomial multipliers disposed in a parallel datapath to generate multiple updated CRCs corresponding to multiple headers of the frame.

In Example 3, the subject matter of Example 2 can optionally include wherein the CRC storage device is accessible by the multiple polynomial multipliers in parallel.

In Example 4, the subject matter of any of Examples 1-3 can optionally include wherein the CRC storage device comprises a count-indexed read only memory (ROM).

In Example 5, the subject matter of any of Examples 2-4 can optionally include circuitry to combine the multiple updated CRCs.

In Example 6, the subject matter of Example 5 can optionally include wherein the circuitry to combine the multiple updated CRCs comprises an exclusive OR (XOR) tree.

In Example 7, the subject matter of any of Examples 5-6 can optionally include circuitry to combine the combined multiple updated CRCs with a CRC over a remainder of the frame to provide an updated frame CRC.

In Example 8, the subject matter of any of Examples 5-7 can optionally include a feedback path coupled to the circuitry to combine multiple updates to support multiple segments.

In Example 9, the subject matter of any of Examples 2-8 can optionally include a compactor coupled to receive multiple headers and place the headers into correct lanes.

In Example 10, the subject matter of any of Examples 1-9 can optionally include wherein the CRC comprises an Ethernet CRC.

Example 11 includes subject matter include a method, the method comprising receiving a communications packet; obtaining an old cyclic redundancy check (CRC) corresponding to an old header of the communications packet; obtaining at least one change to at least one header to provide at least one changed header; calculating a CRC over the at least one changed header to generate a calculated CRC; and updating the old CRC based on the calculated CRC.

In Example 12, the subject matter of Example 11 optionally includes wherein the at least one change comprises a plurality of changes to a plurality of headers.

In Example 13, the subject matter of Example 12 optionally includes calculating the CRC over the plurality of changes to the plurality of headers by calculating a CRC for each of the plurality of changes to the plurality of headers in parallel datapaths.

In Example 14, the subject matter of Example 13 optionally includes wherein updating the old CRC is based on the calculated CRCs for each of the plurality of changes.

In Example 15, the subject matter of any of Examples 12-14 can optionally include wherein calculating the CRC over the at least one changed portion comprises obtaining CRC coefficients from a storage device; and using the CRC coefficient in a polynomial multiplication representative of the packet to advance the CRC corresponding to a position of the changed header in the packet.

In Example 16, the subject matter of any of Examples 12-15 can optionally include wherein the coefficients are bits MOD 2.

In Example 17, the subject matter of any of Examples 12-16 can optionally include wherein the CRC of the packet is calculated by feeding n into the storage device implementing xs mod P where n is the number of bytes following the changed header and P an Ethernet CRC polynomial.

Example 18 include a mechanism (e.g., a hardware switch fixed-logic silicon switch, etc.) comprising ingress ports for receiving a data packet having multiple headers and an old cyclic redundancy code (CRC) that corresponds to an old header of the data packet, and to provide the multiple headers; and control circuitry coupled to the ingress ports and configured to receive the packet, the old CRC, and a modified old header of the data packet, calculate a new CRC on the modified old header, and generate an update for the CRC of the frame based on a CRC coefficient.

In Example 19, the subject matter of Example 18 can optionally further include storage to store CRC coefficients.

In Example 20, the subject matter of any of Examples 18-19 can optionally include wherein the storage is accessible by multiple paths of the control circuitry in parallel.

Example 21 includes subject matter (such as a control device, interplane control device, control plane processor, CRC update device, computer device and or any other electrical apparatus, device or processor) including a plurality of sets of inputs, each of the plurality of sets of inputs to receive respective headers of a communication packet and old CRCs for the respective headers; a CRC calculator and a polynomial multiplier coupled to each of the set of inputs to calculate an updated CRC for each respective header based at least on respective old CRCs; and a compactor coupled to receive each updated CRC, to and to generate a final CRC for the communication packet.

In Example 22, the subject matter of Example 21 can optionally further include wherein each of the plurality of sets of inputs includes an expander circuit to expand data from each respective header of the communication packet and to provide expanded data to the compactor.

In Example 23, the subject matter of any of Examples 21 and 22 can optionally include circuitry to combine the updated CRCs for each respective header.

In Example 24, the subject matter of Example 23 can optionally include wherein the circuitry to combine the updated CRCs comprises an exclusive OR (XOR) tree.

In Example 25, the subject matter of Example 24 can optionally include wherein the XOR tree provides an output to the compactor for generating the final CRC.

Example 26 include a mechanism (e.g., a hardware switch, fixed-logic silicon switch, etc.) comprising ingress ports for receiving a data packet having multiple headers; and control circuitry coupled to the ingress ports and configured to receive the packet, the old CRC, and a modified old header of the data packet, calculate a new CRC on the modified old header, generate an update for the CRC of the frame based on a CRC coefficient, and perform a compaction, and generate a final CRC for the communication packet based on the compaction.

Example 27 includes subject matter include a method, the method comprising receiving a plurality of headers of a communication packet; calculating, based on a polynomial multiplier using a coefficient storage device, an updated CRC for each respective header; compacting each updated CRC, and data for the communication packet, into output lanes; and generating a final CRC, subsequent to the compacting.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Tus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A method of updating a cyclic redundancy code (CRC) of a packet in an apparatus, the method comprising:
    processing the packet as the packet traverses a datapath of the apparatus, the processing comprising:
        determining whether a header of the packet has changed to a new header, wherein the packet includes a single CRC value and wherein the single CRC value is separate from the header of the packet; and
        in response to a determination that the header has changed, modifying the packet by updating an existing value of the single CRC value to a new CRC value without using a contribution of a payload of the packet to the updating.

2. The method of claim 1, wherein the processing further comprises:
    calculating an existing contribution of the header to the existing value of the single CRC value; and
    calculating a new contribution of the new header to the new CRC;
    wherein the updating comprises replacing the existing contribution with the new contribution.

3. The method of claim 2, wherein the processing further comprises, prior to updating the existing value of the single CRC value, advancing the existing value of the single CRC value by at least a number of bytes occurring after the header and advancing the new CRC by at least a number of bytes occurring after the new header.

4. The method of claim 3, wherein if the packet contains multiple headers, at least one of which changes:
    advancing the existing value of the single CRC value comprises advancing the existing value of the single CRC value by a number of bytes occurring after all headers of the packet prior to changing the header of the packet to the new header, and
    advancing the new CRC comprises advancing the existing value of the single CRC value by a number of bytes occurring after all headers of the packet after changing the header of the packet to the new header.

5. The method of claim 4, wherein the processing further comprises, for each of the headers:
    determining whether the header has changed to a second header; and
    in response to a determination that the header has changed to the second header, calculating a second contribution of the second header to the new CRC; and
    the updating comprises replacing a first contribution with the second contribution if the header has changed and maintaining the first contribution if the header has not changed.

6. The method of claim 2, wherein the processing further comprises compacting the packet having the new header after calculating the new contribution and prior to updating the existing value of the single CRC value.

7. The method of claim 6, wherein:
a first latency is associated with calculating the existing contribution,
a second latency is associated with calculating the new contribution,
a sum of the first and second latency is shorter than a latency associated with changing the header to the new header and compacting the packet.

8. The method of claim 1, wherein the processing further comprises, for updating of the existing value of the single CRC value, storing the payload of the packet without storing the header.

9. The method of claim 1, wherein the processing further comprises:
parsing the packet and determining a routing modification of the packet; and
providing packet to a data plane interface of the apparatus.

10. The method of claim 1, wherein the apparatus is a switch.

11. An apparatus comprising processing circuitry and memory,
wherein the processing circuitry is configured to:
determine whether a header of a packet traversing a datapath of the apparatus has changed to a new header, wherein the packet includes a single cyclic redundancy code (CRC) value; and
in response to a determination that the header has changed, modify the packet by updating an existing value of the single CRC value to a new CRC value without using a contribution of a payload of the packet to the updating, and the memory is configured to store the payload, the new header of the packet.

12. The apparatus of claim 11, wherein the processing circuitry is further configured to:
calculate an existing contribution of the header to the existing value of the single CRC value; and
calculate a new contribution of the new header to the new CRC; and
update the CRC by replacing the existing contribution with the new contribution.

13. The apparatus of claim 12, wherein the processing circuitry is further configured to, prior to updating the existing value of the single CRC value, advance the existing value of the single CRC value by at least a number of bytes occurring after the header and advance the new CRC by at least a number of bytes occurring after the new header.

14. The apparatus of claim 13, wherein the processing circuitry is further configured to, if the packet contains multiple headers, at least one of which changes:
advance the existing value of the single CRC value by advancing the existing value of the single CRC value by a number of bytes occurring after all headers of the packet prior to changing the header of the packet to the new header, and
advance the new CRC by advancing the existing value of the single CRC value by a number of bytes occurring after all headers of the packet after changing the header of the packet to the new header.

15. The apparatus of claim 14, wherein the processing circuitry is further configured to, for each of the headers:
determine whether the header has changed to a second header; and
in response to a determination that the header has changed to the second header, calculate a second contribution of the second header to the new CRC; and
update the CRC by replacing a first contribution with the second contribution if the header has changed and maintaining the first contribution if the header has not changed.

16. The apparatus of claim 12, wherein the processing circuitry is further configured to compact the packet having the new header after calculating the new contribution and prior to updating the existing value of the single CRC value.

17. The apparatus of claim 16, wherein:
a first latency is associated with calculating the existing contribution,
a second latency is associated with calculating the new contribution,
a sum of the first and second latency is shorter than a latency associated with changing the header to the new header and compacting the packet.

18. The apparatus of claim 11, wherein the processing circuitry is further configured to, for update the existing value of the single CRC value, store the payload of the packet without storing the header.

19. The apparatus of claim 11, wherein the processing circuitry is further configured to:
parse the packet and determine a routing modification of the packet; and
provide packet to a data plane interface of the apparatus.

20. The apparatus of claim 11, wherein the apparatus is a switch.

21. The apparatus of claim 11, wherein the determination that the header has changed is based on the header including multiple headers.

* * * * *